(12) United States Patent
Fitt

(10) Patent No.: US 7,970,667 B2
(45) Date of Patent: Jun. 28, 2011

(54) SYSTEM, METHOD, AND COMPUTER PROGRAM PRODUCT FOR A GEOMETRIC SEARCH OF A CONFIGURABLE PRODUCT STRUCTURE

(75) Inventor: Andrew J. Fitt, Cambridge (GB)

(73) Assignee: Siemens Industry, Inc., Alpharetta, GA (US)

( * ) Notice: Subject to any disclaimer, the term of this patent is extended or adjusted under 35 U.S.C. 154(b) by 0 days.

(21) Appl. No.: 12/548,770

(22) Filed: Aug. 27, 2009

(65) Prior Publication Data

US 2010/0057729 A1      Mar. 4, 2010

Related U.S. Application Data

(60) Provisional application No. 61/093,127, filed on Aug. 29, 2008.

(51) Int. Cl.
*A01K 5/02* (2006.01)
*G06F 19/00* (2006.01)

(52) U.S. Cl. .......................... 705/29; 700/105
(58) Field of Classification Search ........................ None
See application file for complete search history.

(56) References Cited

U.S. PATENT DOCUMENTS

| 6,999,965 B1 * | 2/2006 | Cesarotti et al. ............... 1/1 |
| 2006/0155407 A1 * | 7/2006 | Azuma ........................ 700/105 |

FOREIGN PATENT DOCUMENTS

WO    WO/2005/038708    *    4/2005

OTHER PUBLICATIONS

Romanowski, et al. Published by IEEE Transactions on Systems, Man, And Cybernetics Part A: Systems And Humans. Institute of Electrical and Electronics Engineers Inc. vol. 35, No. 2, Mar. 2005 (pp. 249-260); Magazine.
"B-tree", wikipedia, Dec. 3, 2009, 13 pages.
"Minimum bounding rectangle", wikipedia, Aug. 4, 2009, 2 pages.

* cited by examiner

*Primary Examiner* — F. Ryan Zeender
*Assistant Examiner* — Denisse Ortiz Roman
(74) *Attorney, Agent, or Firm* — Michael J. Wallace, Jr.

(57) ABSTRACT

A method for searching a bill of materials (BOM) in a data processing system, a data processing system configured to perform a corresponding method, and a computer program product encoded with instructions for performing the method. The method includes retrieving BOM data in a data processing system, and forming a wavefront queue of a plurality of proto lines corresponding to the BOM data. The method also includes determining the cumulative geometric bounds of multiple ones of the plurality of proto lines and performing a geometric bounds test on the cumulative geometric bounds of multiple ones of the plurality of proto lines. The method also includes producing a BOM line to each proto line that passes the geometric bounds test, and adding the produced BOM lines to a candidate results list stored in the data processing system.

21 Claims, 9 Drawing Sheets

FIG. 6A

| PART |
|---|
| A |
| B |

| PART REVISION | PART | GEOMETRIC BOUND |
|---|---|---|
| A1 | A | -1 TO +1 |
| B1 | B | -1 TO +2 |
| B2 | B | -1 TO +3 |

| ASSEMBLY |
|---|
| C |
| D |

| ASSEMBLY REVISION | ASSEMBLY |
|---|---|
| C1 | C |
| D1 | D |
| D2 | D |

| OCCURRENCE | ASSEMBLY REVISION | PART/ ASSEMBLY | TRANSFORM |
|---|---|---|---|
| C1.1 | C1 | A | -2 |
| C1.2 | C1 | B | 0 |
| D1.1 | D1 | C | 0 |
| D1.2 | D1 | B | +3 |
| D2.1 | D2 | C | 0 |
| D2.2 | D2 | B | +4 |

FIG. 6C

| NODE | OBJECT |
|---|---|
| NODE-A | A |
| NODE-B | B |
| NODE-A1 | A1 |
| NODE-B1 | B1 |
| NODE-B2 | B2 |
| NODE-C | C |
| NODE-D | D |
| NODE-C1 | C1 |
| NODE-D1 | D1 |
| NODE-D2 | D2 |
| NODE-C1.1 | C1.1 |
| NODE-C1.2 | C1.2 |
| NODE-D1.1 | D1.1 |
| NODE-D1.2 | D1.2 |
| NODE-D2.1 | D2.1 |
| NODE-D2.2 | D2.2 |

| EDGE | NODE | DEPENDS ON |
|---|---|---|
| EDGE-A-A1 | NODE-A | NODE-A1 |
| EDGE-B-B1 | NODE-B | NODE-B1 |
| EDGE-B-B2 | NODE-B | NODE-B2 |
| EDGE-C-C1 | NODE-C | NODE-C1 |
| EDGE-D-D1 | NODE-D | NODE-D1 |
| EDGE-D-D2 | NODE-D | NODE-D2 |
| EDGE-C1-C1.1 | NODE-C1 | NODE-C1.1 |
| EDGE-C1-C1.2 | NODE-C1 | NODE-C1.2 |
| EDGE-D1-D1.1 | NODE-D1 | NODE-D1.1 |
| EDGE-D1-D1.2 | NODE-D1 | NODE-D1.2 |
| EDGE-D2-D2.1 | NODE-D2 | NODE-D2.1 |
| EDGE-D2-D2.2 | NODE-D2 | NODE-D2.2 |
| EDGE-C1.1-A | NODE-C1.1 | NODE-A |
| EDGE-D1.1-C | NODE-D1.1 | NODE-C |
| EDGE-D1.2-B | NODE-D1.2 | NODE-B |
| EDGE-D2.1-C | NODE-D2.1 | NODE-C |
| EDGE-D2.2-B | NODE-D2.2 | NODE-B |

SYSTEM, METHOD, AND COMPUTER PROGRAM PRODUCT FOR A GEOMETRIC SEARCH OF A CONFIGURABLE PRODUCT STRUCTURE

CROSS-REFERENCE TO OTHER APPLICATION

This application claims priority from U.S. Provisional Patent Application 61/093,127, filed Aug. 29, 2008, which is hereby incorporated by reference.

TECHNICAL FIELD

The present disclosure is directed, in general, to computer-aided design, visualization, and manufacturing systems, and similar systems, referred to herein individually and collectively as "CAD systems."

BACKGROUND OF THE DISCLOSURE

CAD systems are useful for manufacturing and other purposes, and can be used for the design of specific multi-part products.

SUMMARY OF THE DISCLOSURE

Various disclosed embodiments include a method for searching a bill of materials (BOM) in a data processing system, a data processing system configured to perform a corresponding method, and a computer program product on a computer readable medium encoded with instructions for performing a similar method. The method includes retrieving BOM data in a data processing system, and forming a wavefront queue of a plurality of proto lines corresponding to the BOM data. The method also includes determining the cumulative geometric bounds of multiple ones of the plurality of proto lines and performing a geometric bounds test on the cumulative geometric bounds of multiple ones of the plurality of proto lines. The method also includes producing a BOM line to each proto line that passes the geometric bounds test, and adding the produced BOM lines to a candidate results list stored in the data processing system.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 6a-6c illustrate exemplary data and graphs processed in accordance with disclosed embodiments.

DETAILED DESCRIPTION

Figure 1:
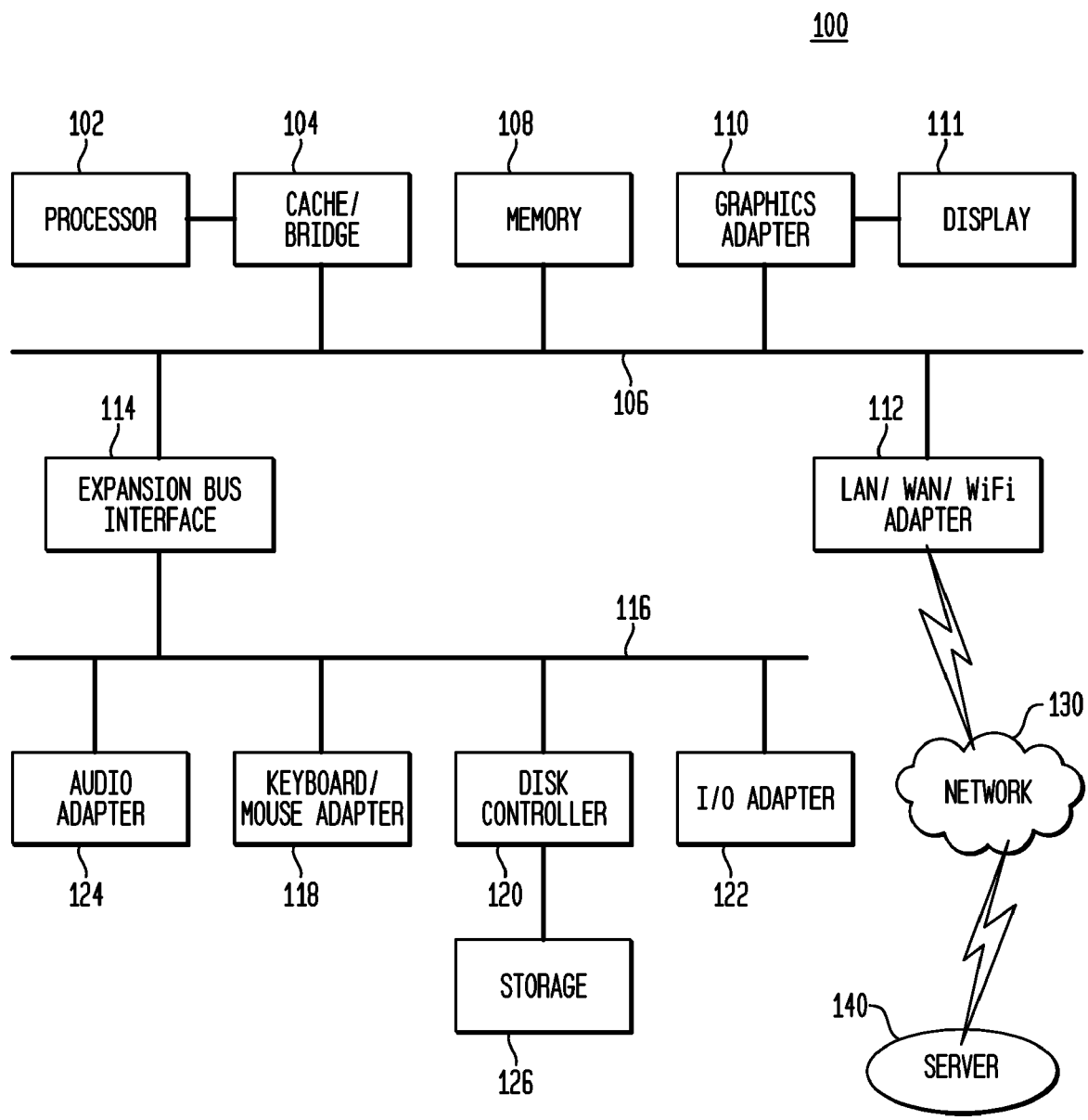
FIG. 1 depicts a block diagram of a data processing system in which an embodiment can be implemented.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Particular terms as used herein are indicated below. These definitions describe the typical use of these terms herein, but those of skill in the art will recognize when the context requires a different meaning known to those of ordinary skill in the art.

BOM: Bill Of Materials

BOM line: An exploded, configured instance of a part or assembly.

BOM tree: A tree of assembled BOM lines.

Bounding box: A set of mutually-orthogonal bounding intervals. In three dimensions, an axis-aligned bounding box consists of an x bounding interval, a y bounding interval and a z bounding interval.

Cumulative geometric bound: The geometric bound of an object, including logically-contained objects. For a BOM line this includes the bounds of child BOM lines.

Local geometric bound: The geometric bound of an object, excluding logically-contained objects.

Occurrence: The use of a part or subassembly within an assembly.

Override: Replacement value, or replacement substructure for an individual BOM line in a BOM tree.

Revision: A single version of a versioned object.

Revision rule: An algorithm or process for computing at most a single revision for a revisable object. If no revision is produced, the object is not configured.

Simplification rule: An algorithm or process for computing a single, possibly simpler, bound from a set of bounds.

In CAD systems, products are composed out of parts. Parts can be composed into assemblies, and assemblies can be composed out of parts or assemblies or both. Both parts and assemblies can be "versioned," meaning stored as differing versions of the same part with different characteristics or options. A part version defines a set of part data. An assembly version defines a set of assembly data, including which parts and sub-assemblies to assemble.

Parts occupy geometric volume, both when manufactured and in a CAD system virtualization. Each occurrence of a geometric part or a geometric assembly within another geometric assembly requires a geometric transform to position the part volume in a common geometric space.

An assembly or part can be exploded and configured to produce a Bill-Of-Materials (BOM) tree of BOM lines. Explosion permutes the assembly/sub-assembly paths to produce the correct number of part lines for each part in the BOM tree and the correct number of assembly lines for each assembly in the BOM tree. The position of a line within the tree is given by the concatenation of transforms along the (single) path from a line to the root line. A configuration rule uses a configuration rule to determine which single part revision to use for a given part in the BOM tree, and which single assembly revision to use for a given assembly in the BOM tree.

An assembly can define overrides that change geometric values (geometric volume; geometric transform) or assembly values (add subassemblies; remove subassemblies) for individual paths. Override values are also versioned, and are also configured by a configuration rule. A BOM tree is constructed with overridden values, where available.

A BOM tree can be constructed using any part or assembly out of the full set of parts and assemblies for the root BOM line. Different configuration rules can be used to construct different BOM trees for the same part or assembly. Examples include: different points in time; different product variants; different combinations of released and work-in-progress data.

One difficulty in conventional systems is to define a space- and time-efficient index for geometric part, assembly and override data that allows a range of efficient geometric queries on a BOM tree. The index must be time-efficient not just for construction, but also for incremental maintenance as geometric and assembly data is edited.

Exploding and configuring BOM trees takes time. Current CAD system hardware makes the creation of extremely large BOM trees feasible, but the construction of these BOM trees is not always fast. In practice the construction of the full BOM tree is not always required—many user tasks can be completed using a subset of the full BOM tree. When the time taken to determine-and-construct the subset is significantly shorter than the time it takes to construct-and-search the full BOM tree, the software will perform better. When the resources used to determine and construct the subset are smaller than the resources taken to construct and search the full BOM tree, the software will scale better.

Many geometric user tasks require a subset of BOM lines that can only be determined geometrically. CAD system that use Product Data Management systems for vaulting and configuration are two examples of client applications that can benefit from the fast, scalable geometric searches in accordance with disclosed embodiments. The various embodiments disclosed herein enable the geometric index to be updated efficiently, and maintained live, and the geometric index can be used to search any constructible BOM tree. In particular, the BOM tree can be rooted in any assembly, and can be constructed using any configuration rule.

Another difficulty in conventional systems is to locate BOM lines within the BOM tree that satisfy geometric tests. Examples of proximity tests include determining which BOM lines contain points within 10 mm of a given BOM line, determining which BOM lines contain points between 50 mm and 100 mm distant from a given BOM line, determining which BOM lines contain a point on a given infinite plane, determining, which BOM lines lie wholly within a geometric box, or determining which BOM lines have a volume of more than 1000 cubic cm.

FIG. 1 depicts a block diagram of a data processing system in which an embodiment can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Many engineering decisions require knowledge of the parts adjacent to or nearby the part(s) that are being worked on. The creation of section drawings requires finding which parts intersect the section plane. In some engineering disciplines, an established method of assigning responsibility is to assign by volume region. Each of these requirements also requires locating BOM lines using a geometric search. The embodiments herein use a geometric index invention to find BOM lines without constructing or caching the full BOM tree.

A protoline, in the context of a bill of materials, defines a path through an existing or to-be-configured structure and identifies a set of object permutations where each object permutation can be used to construct a configured BOM line.

A proto line describes a path through the BOM tree, and a single value of the geometric transform along that path (or another means of specifying location). A proto line can contain a mixture of configured and unconfigured data.

When a configuration rule is applied to a proto line either a single BOM line will be produced (with the same path and geometric location as the proto line) or no BOM line will be produced (and the proto line is not configured).

Figure 2A:
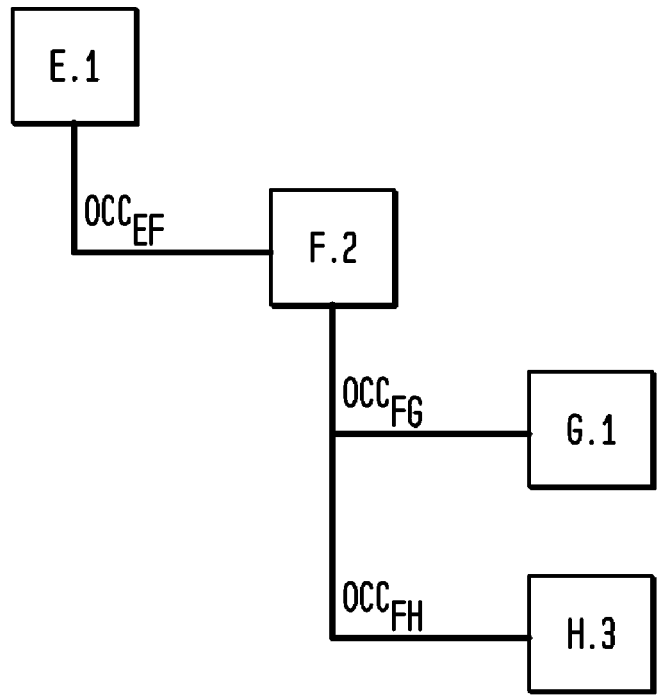
FIGS. 2a-2b illustrate BOM lines and proto lines.
Figure 2B:
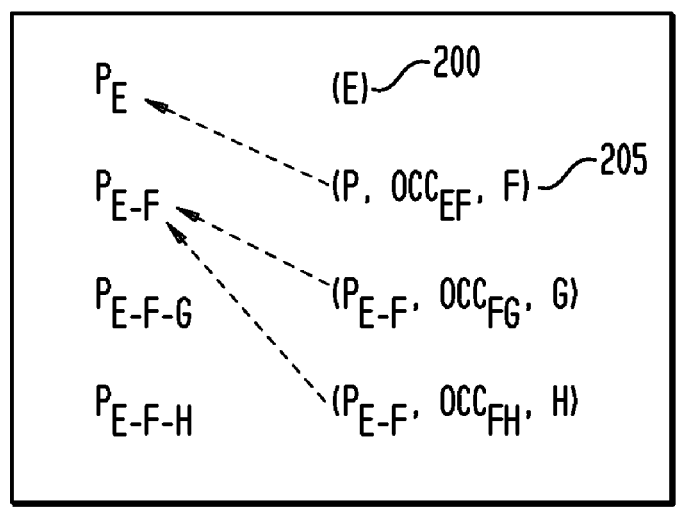

FIGS. 2a and 2b illustrate an example of a simple BOM tree and corresponding protoline reference, respectively.

In the simple BOM tree of FIG. 2a, assembly E at version E.1 has a sub-assembly F. Subassembly F at version F.2 has two components, G at version G.1 and H at version H.3. Of course, there may be other versions of each assembly, subassembly, and component that form different BOM trees. The exploded view of the BOM of FIG. 2a gives an easy and intuitive view of the relationships between various components of the assembly.

FIG. 2b illustrates examples of protolines corresponding to the BOM tree of FIG. 2a. These include (1) a single component 200, and (2) a triple-member assembly 205 that has a protoline, occurrence, and component. The occurrence is a parent-child link and is required to uniquely identify the individual child component or combine them with occurrences as well as references to parent protolines. The protoline $P_E$ represents the top level assembly E. The protoline $P_{E-F}$ consists of a reference to $P_E$, the parent protoline, $Occ_{EF}$ reflects the occurrence of sub-assembly F in assembly E, and lastly the assembly F. The protoline contains reference to the higher level assembly contexts that cause an override.

A wavefront queue describes the boundary of exploration through a BOM tree. The protolines can be removed from the queue one at a time, or in batches to increase throughput by batch processing. The wavefront queue can be a simple queue, a priority queue, or some other sequencing mechanism known to those of skill in the art. The wavefront describes the boundary of exploration through the BOM tree. Choice of a depth-first search order will tend to keep the wavefront small. Choice of a depth-first search order will tend to produce larger batches especially suitable for batch processing. A hybrid choice can be tuned to balance wavefront size against batch size.

Embodiments disclosed herein locate the BOM lines in a BOM tree that satisfy a geometric test. Various embodiments use a geometric index to obtain a set of candidate BOM lines that may satisfy the geometric test.

Figure 3:
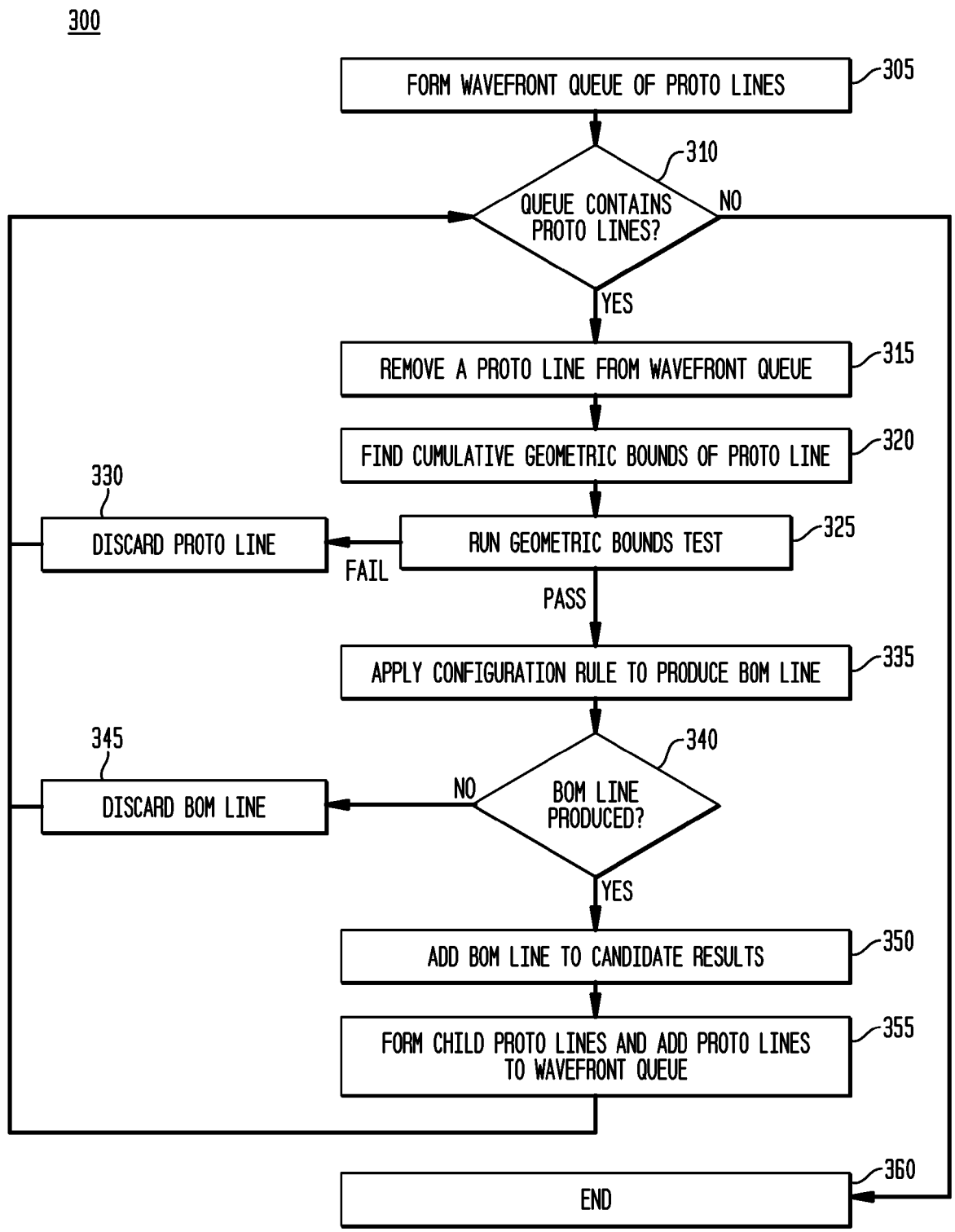
FIGS. 3-5 depict flowcharts of processes in accordance with a disclosed embodiment.

FIG. 3 depicts a flowchart of a process 300 in accordance with a disclosed embodiment.

The system will retrieve or receive BOM data and form a wavefront queue of multiple proto lines, seeded with the root proto line for the BOM tree (step 305). A proto line identifies an individual BOM line before the BOM line is configured. The wavefront is the boundary of exploration of the BOM tree.

While the wavefront queue contains proto lines (step 310), the system will perform the following processes:

The system removes a proto line from the wavefront queue (step 315).

The system determines the cumulative geometric bounds of the proto line, preferably from the geometric bound index (step 320).

The system performs a geometric bound test on the cumulative geometric bounds (step 325). If the geometric bound test fails, the system will discard the proto line (step 330), and continue the loop from step 310, since any BOM line configured from this proto line cannot pass the geometric test, and any BOM line having this proto line as an ancestor cannot pass the geometric test. This subtree of the BOM tree is pruned by discarding the proto line.

If the geometric bound test passes, the system applies the configuration rule to produce a BOM line from the proto line (step 335).

If there is no BOM line produced (step 340), the system discards the BOM line (step 345) and continues the loop from step 310.

If a BOM line is produced, the system adds the BOM line to the candidate results that may be stored in a candidate results list (step 350).

The system then forms a set of child proto lines from the children of the proto line (step 355), and adds the set of child proto lines to the wavefront queue.

The process ends when no proto lines remain the wavefront queue (step 360).

The candidate results are stored in the system, and optionally displayed to a user, and will contain all the BOM lines that satisfy the geometric test. In some cases, the candidate results may also contain false positives, both because the system tests geometric bounds (not the geometry itself) and because the system uses the geometric index, not the true BOM line bounds. The candidate results can be turned into a set of confirmed results by, for example, running the geometric test for each candidate BOM line in the candidate results.

Those of skill in the art recognize that various methods for the geometric test may be utilized where, for example, the test begins with a set of geometric bounds, and returns true if there exists a geometric shape within the bounds. For example, if searching for objects contained or partially contained within a given volume, the geometric bound test must return true if there exists a point within or on the geometric bounds which lies within the given volume.

Geometric bound test: A geometric bound test takes a set of geometric bounds, and returns true if there exists a geometric shape within these bounds that satisfies the geometric test.

For example, if the system is searching for objects contained or partially contained within a given volume, the geometric bound test must return true if there exists a point within or on the geometric bounds which (transformed) lies within the given volume.

Cumulative bounds: Cumulative bounds bound not just a BOM line itself, but also bound the geometric data of the BOM line children. When a cumulative bound test fails, it is safe to discard not just the proto line or BOM line, but also to discard all of its possible children. This early pruning results in particularly good performance of the disclosed embodiments.

Overrides: The value of any geometric and assembly overrides are preferably included when finding cumulative bounds for proto lines, and when finding local geometry for BOM lines. Further, it is preferable to include the value of any geometric and assembly overrides when generating proto lines.

Disclosed embodiments locate BOM lines within a BOM tree that could satisfy the given geometric test. Information in the geometric index is used to prune sub-trees, and to avoid running the configuration rule for many lines which can never match the geometric test. The system uses the configuration rule to avoid processing unconfigured parts of the BOM tree, and to ensure that the search terminates.

The disclosed embodiments improve on brute-force BOM-line searches for many real-world examples, because the index geometric bound tests discard a large portion of the BOM tree, which never needs to be generated or tested. This helps both performance of the invention and scalability of the deployment.

Some systems use a range of caches to support geometric queries. These are all based upon taking a snapshot of a BOM tree, and persisting geometric bounding boxes, or other geometric information for the BOM lines. These solutions perform well, but require searchable BOM trees to be defined (and maintained) well ahead of search time. By using a maintainable geometric index, various embodiments can locate BOM lines for the full range of BOM trees, whether these vary by the root assembly chosen, or by the configuration rule.

It is always possible to compute (local) geometric bounds for a proto line. For example, when there are no overrides the bounds of a part are the (transformed) bounds of all the part revisions. Various embodiments use local geometric bounds to avoid (some) false positives in the candidate results. The system runs a geometric bound test on the local geometric bounds. If the test fails, the system does not add the BOM line to the candidate results.

The disclosed embodiments are not limited to bound tests on the objects described above. Where intermediate objects are created or used (for example during configuration of a BOM line, or while finding child proto lines), and the intermediate objects are themselves indexed in the geometric index (or the bounds can be constructed from the geometric index) the geometric bound test can be applied to these intermediate objects. Where the geometric bound test fails, either configuration can be terminated early, or the size of the wavefront can be reduced.

As described above, the wavefront of BOM lines moves down the BOM tree just after the wavefront of proto lines. The BOM-line wavefront is never more than one parent assembly behind the proto-line wavefront, and at the end of the loop the two wavefronts are in step.

Some embodiments allow the proto-line wavefront to advance further in front of the BOM-line wavefront. As the proto-line wavefront advances, information is updated on the directions the BOM-line wavefront can advance in. As the BOM-line wavefront advances, proto-lines that can no-longer be configured are removed from the proto-line wavefront.

Delayed configuration is a good strategy when configuration is much slower than geometric index bounds tests, and when the proto-line wavefront with delayed configuration does not expand much more rapidly than the proto-line wavefront without delayed configuration.

The amount of delay can be tuned depending on how rapidly the proto-line wavefront expands, and how likely advancing the BOM-line wavefront is to reduce the proto-line wavefront.

Composite proto lines: Some embodiments group sets of proto lines together into a single composite proto line, where the individual proto lines share a common path through the BOM tree. This reduces the size of the wavefront. Several faster geometric bounds tests are possible for the composite proto line when compared with testing the individual proto lines. There is also an extra risk of false positives.

Figure 4:
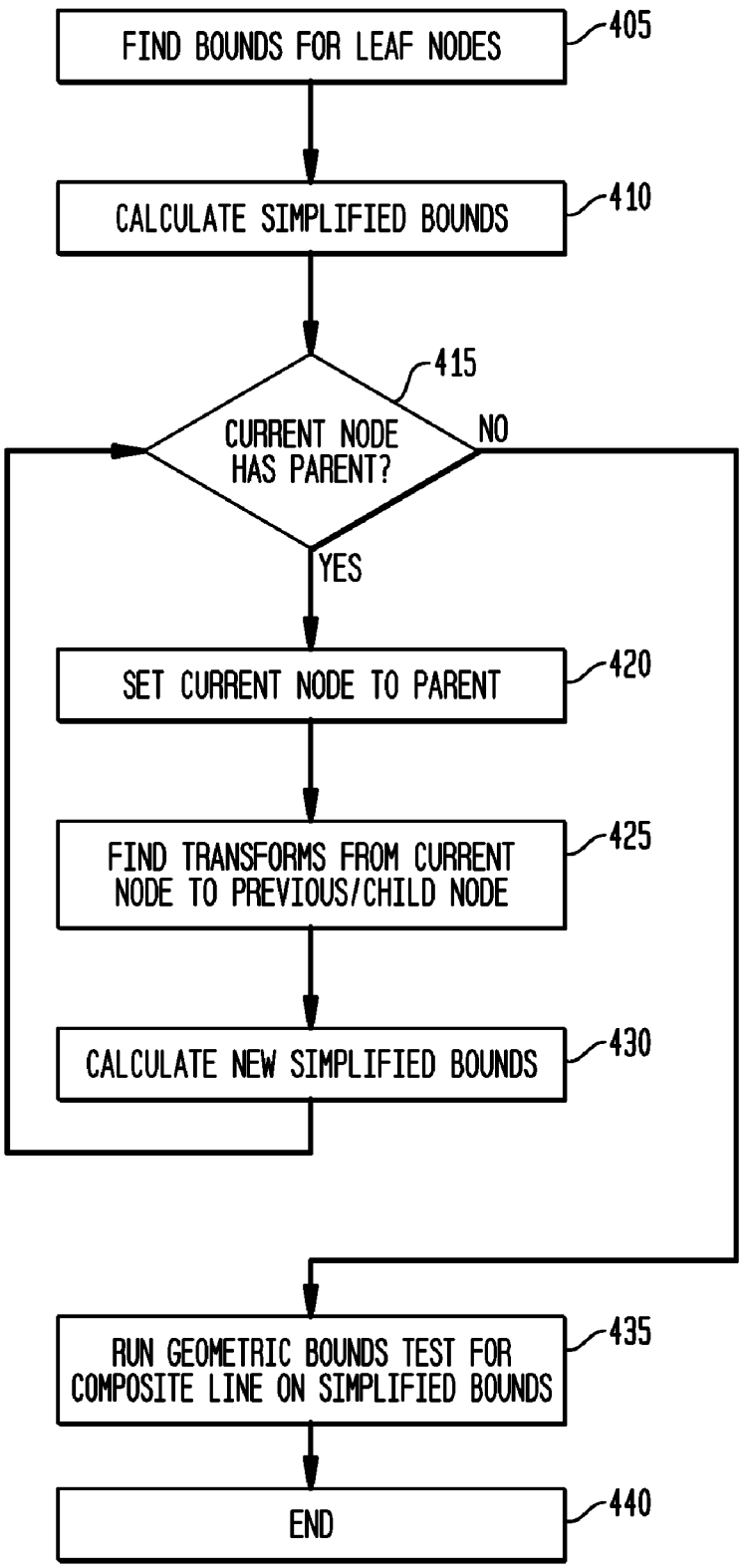

FIG. 4 illustrates an example of a bounds test process 400 that avoids the full proto-line permutation.

The system finds all bounds for the leaf node, ignoring all parents (step 405).

The system calculates a set of simplified bounds for the leaf node (step 410).

While the current node has a parent (step 415), the system performs the following processes.

The system sets the current node to the parent (step 420).

The system finds all transforms from the current node to the previous (child) node (step 425).

The system calculates a new set of simplified bounds, permuting the transforms and the old set of simplified bounds (step 430), and returns to step 415.

When the current node no longer has a parent (at step 415), the system runs the geometric bounds test for the composite line on the simplified bounds calculated above (step 435), and ends (step 440).

Part-geometric queries: The geometric tests can form a geometric component to a more complex search query.

Non-geometric data: Where a bounded index is available for non-geometric data, various embodiments can search the non-geometric data. The cumulative geometric bounds test on the index values is replaced by a cumulative non-geometric bounds test on the index values.

Figure 5:
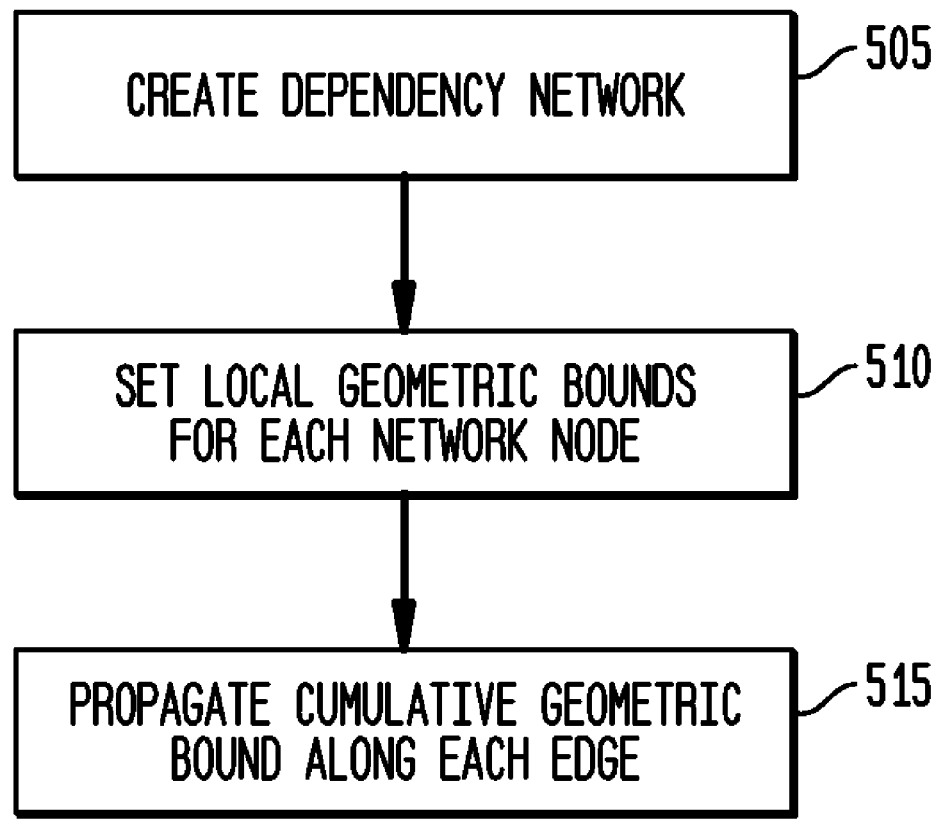

Various embodiments can use a defined index structure for spatial data, also referred to herein as a geometric bounds index. The geometric bounds index can be constructed using a process as illustrated in the flowchart of FIG. 5. These steps are also described in more detail herein.

First, the system will represent an unconfigured structure by a geometric dependency network of nodes and edges (step 505). The dependency network is stored in the system and optionally displayed to the user.

Next, the system will set the local geometric bounds for each network node (step 510).

The system will propagate the cumulative geometric bound along each network edge (step 515) to construct the index structure. The system simplifies the cumulative geometric bound at each network node during propagation. The simplified geometric bound is stored in the system for use as described above.

The geometric bound of each network node forms the spatial-index geometric bound for the matching data model object. A persisted geometric index of the persisted data model is especially useful for rapid search. It is possible to omit some of the network nodes from the persisted index. The values (if required) can be recovered using a local calculation.

The sample data shown in FIG. 6a is used as a non-limiting example. This example uses one-dimensional bounds for simplicity, but the disclosed embodiments apply equally to two-, three- and other-dimensional bounds.

Forming a geometric dependency network (step 505): Each node in the geometric dependency network represents an object for which geometric bounds can be calculated. Each object is part of the data model that to be indexed.

For example, geometric bounds can be calculated for part revisions, for parts, for transformed occurrences of a part, for assembly revisions, and for assemblies. Geometric bounds can also be calculated for geometric overrides, and structure overrides to geometric structure.

Each directed edge in the geometric dependency network represents a dependency of the geometric bound of one node on the geometric bound of another node. Dependencies come from different sources, including, but not limited to (a) Conditional selection of one object by another object. For example the geometric bound of an (unconfigured) part depends on the geometric bound of each part revision which can be selected (configured) for that part.

(b) Containment of one object by another object. For example the geometric bound of an assembly revision depends on the geometric bound of each part occurrence which the assembly revision contains.

(c) Transformation of one object by another object. For example the geometric bound of a part occurrence depends on the transformed geometric bound of the part it contains. The assembly transform of the occurrence is used in the transformation.

Overrides are also represented by adding nodes and edges to the geometric dependency network. Override objects are represented by network nodes. When an override object uses a non-overridden value from a part or assembly object, the override node depends on the value node, and the dependency becomes a network edge. When an assembly can be configured to contain an override, the assembly node depends on the override node, and the dependency becomes a network edge.

The geometric dependency network models geometric data use and geometric containment.

If a BOM line A is the ancestor of a BOM line B, there exists a node of BOM line A which is directly or indirectly dependent on each node of BOM line B. The direction of the dependency edges models a (possible) BOM-line containment for some BOM tree.

Figure 6B:
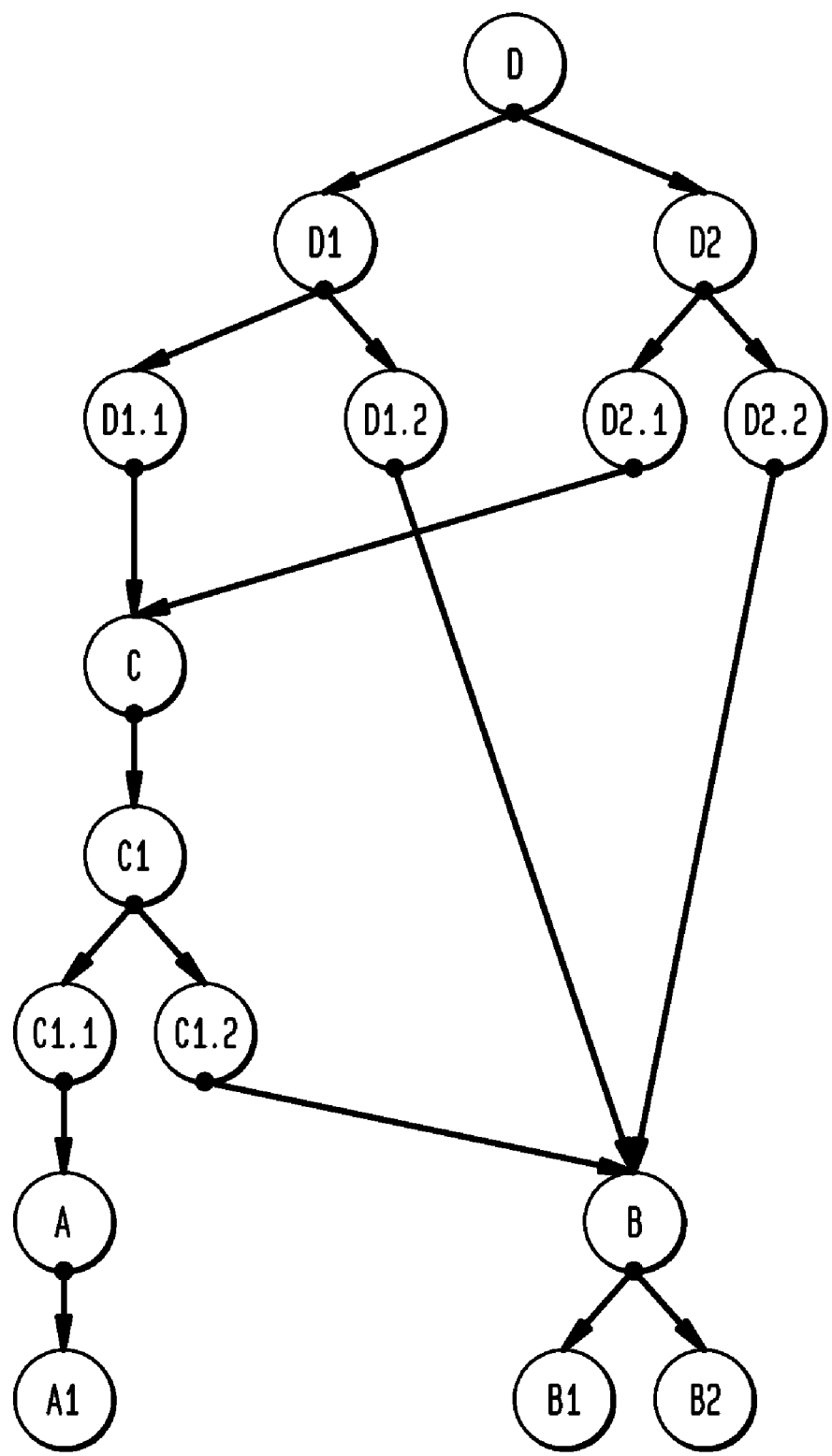

The example data of FIG. 6a gives the nodes and edges illustrated in the graph of FIG. 6b and the chart of FIG. 6c.

Set local geometric bounds on network nodes (step 510): Some objects in the data model will have known geometric bounds, such as individual part revisions, or the over-ridden part geometry of an individual occurrence (perhaps a spring under compression). Attach these known object geometric bounds to the corresponding geometric dependency nodes to form a set of geometric bounds. These are the local geometric bounds of the node—the bounds of geometric data local to that object.

The example data shown in FIG. 6a has these local geometric bounds:

| Node | Local Bounds |
| --- | --- |
| Node-A1 | −1 to +1 |
| Node-B1 | −1 to +2 |
| Node-B2 | −1 to +3 |

Propagate cumulative geometric bounds along network edges (step 515): The system will calculate the cumulative geometric bound for each node as follows:

1. Form the set of adjacent geometric nodes on which the current node depends.

2. Form the set of geometric bounds from the cumulative geometric bound of each adjacent node (as found above) and the set of local geometric bounds of the current node (as described in the preceding step).

3. Simplify the set of geometric bounds (as found above) to form the single, cumulative geometric bound for the current node.

Propagating a geometric bound along some edges may involve a transformation. The index geometric bound of any data model object is the cumulative geometric bound of the matching network node. The example data of FIG. 6a has the following cumulative geometric bounds:

| Node | Cumulative Bound |
| --- | --- |
| Node-A1 | −1 to +1 |
| Node-A | −1 to +1 |
| Node-B1 | −1 to +2 |
| Node-B2 | −1 to +3 |
| Node-B | −1 to +3 |
| Node-C1.1 | −3 to −1 |
| Node-C1.2 | −1 to +3 |
| Node-C1 | −3 to +3 |
| Node-C | −3 to +3 |
| Node-D1.1 | −3 to +3 |
| Node-D1.2 | +2 to +6 |
| Node-D1 | −3 to +6 |
| Node-D2.1 | −3 to +3 |
| Node-D2.2 | +3 to +7 |
| Node-D2 | −3 to +7 |
| Node-D | −3 to +7 |

Note that geometric bounds are transformed along part-occurrence edges as the cumulative geometric bounds are transformed from part space to occurrence space. For example, Node-C1.1 has the transformed bound of Node-A.

This propagation rule defines the cumulative geometric bound of each node, except where a node is part of one or more network cycles. It is still possible to construct an index when the network model contains cycles, and there are a number of options:

1. Set the cumulative geometric bound for each node in a cycle to the infinite bound.

2. Solve the cycle simultaneously to find the cumulative geometric bound of each node. The solution may have finite bounds depending on the group structure.

3. Use application-specific knowledge of cycle validity and cycle breaking to break each cycle. Form the geometric bound of each node in the broken cycle using the normal rules.

Geometric bounds: Any form of geometric bound can be used to build the index. This includes, but is not limited to, a single axis-aligned bounding box (in the object-local coordinate frame); a set of axis-aligned bounding boxes where the geometric union of the boxes forms the bound; a set of axis-aligned bounding boxes formed into an r-tree where the geometric union of the boxes forms the bound; and bounding triangular facets.

Geometric bound simplification (in step 515): As part of propagating geometric bounds, described above, the set of geometric bounds is simplified into a single geometric bound. Simplification serves to reduce the storage size of the spatial index; reduce the complexity of the geometric bound for each node (so tests against the spatial index run faster); and reduce the number of spatial index bounds that must be updated when nodes are either added or removed, and when edges are either added or removed.

Simplification is very effective for product structures for various reasons. Part revisions are form, fit and function compatible. The geometric bound of a part is similar to the geometric bound of each part revision. The geometric bound of any new part revision will be similar to the existing geometric bound of the part.

Further, part assembly revisions tend to contain parts or assemblies which are transformed to be spatially adjacent. Part assembly revisions are themselves form, fit and function compatible.

Using the example of FIG. 6a, the unsimplified bound of B is the set of bounds [B1, B2] or [(−1 to +2), (−1 to +3)]. This can be simplified to the single bound (−1 to +3) which contains both the bounding interval of B1 and B2. Simplification of a set of bounding intervals into one bounding interval is just one example of a simplification rule.

Simplification rules include, but are not limited to:
Simplify a set of axis-aligned bounding boxes to a single axis-aligned bounding box.
Simplify a set of axis-aligned bounding boxes to a small (bounded) set of axis-aligned bounding boxes.

This last simplification rule can avoid combining two intervals when there is a significant gap between them. This trades data storage and test time for a more accurate bound.

Concurrency: The index can be kept consistent in an environment with multiple execution processes or threads, providing a suitable concurrency strategy is in place. One suitable locking strategy for changing the index is to write-lock every node changed; write-lock every node which (directly) depends on a changed edge; and read-lock every unlocked node on which a changed node depends. Where two different processes simultaneously have a sub-network locked, there are no data changes that can propagate from one sub-network into the other.

The geometric bound index has properties that prove useful in a range of geometric search algorithms. The index also has compact storage and time-complexity guarantees that make index construction and maintenance affordable.

Index bound properties: In a configured BOM tree in accordance with various embodiments, the geometric bound of an individual BOM line is itself bounded by the set of index bounds for the data model objects that make up the BOM line. Because the data model objects change (become more precise) when the BOM line is configured, the index bound also changes (becomes more precise) as the BOM line is configured. This configured index bound is itself bounded by the unconfigured index bound.

Figure 7:
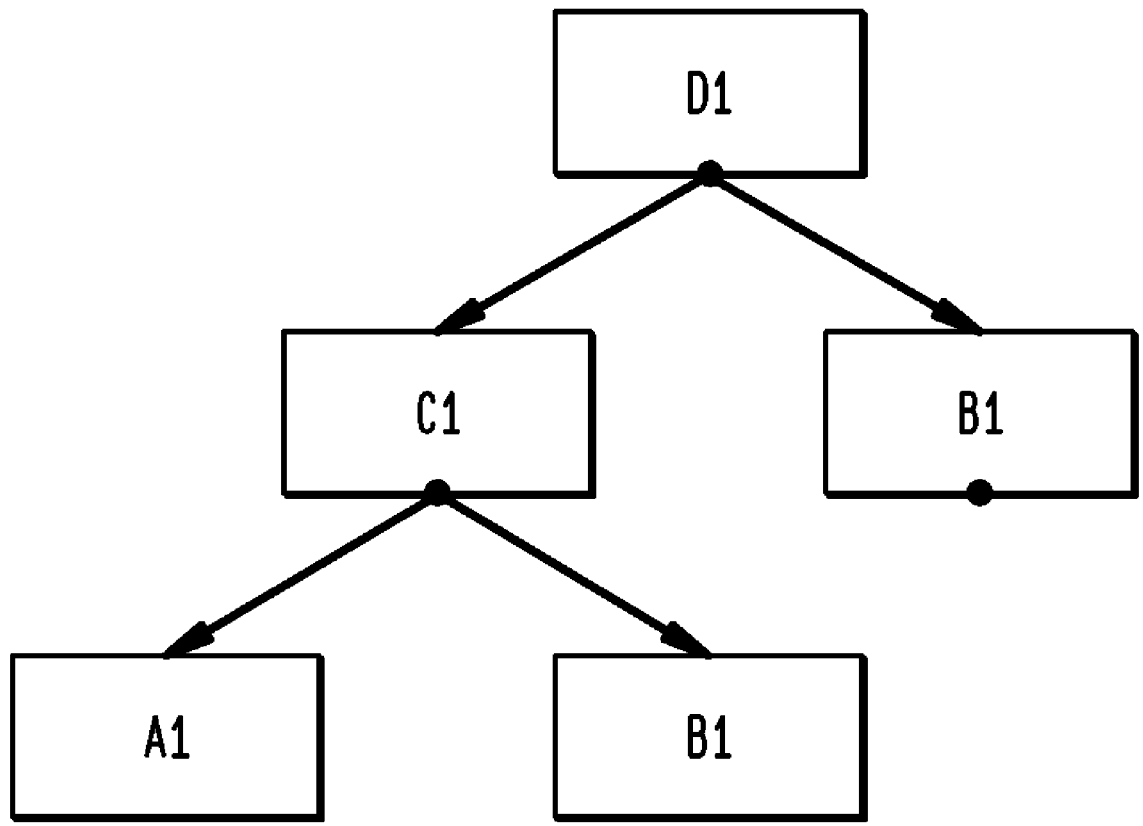
FIG. 7 depicts a simple exemplary BOM tree.

FIG. 7 illustrates a simple exemplary BOM tree. This example can be used to illustrate the following transforms and bounds.

| BOM line | Transform to Root |
| --- | --- |
| D1 | 0 |
| D1.1-C1 | 0 |
| D1.1-C1.1-A1 | −2 |
| D1.1-C1.2-B1 | 0 |
| D1.2-B1 | +3 |

Bounds:

| BOM line | Actual Bound | Configured Index Bound | Unconfigured Index Bound |
| --- | --- | --- | --- |
| D1 | −3 to +5 | −3 to +6 | −3 to +7 |
| D1.1-C1 | −3 to +2 | −3 to +3 | −3 to +3 |
| D1.1-C1.1-A1 | −3 to −1 | −3 to −1 | −3 to −1 |
| D1.1-C1.2-B1 | −1 to +2 | −1 to +2 | −1 to +3 |
| D1.2-B1 | +2 to +5 | +2 to +5 | +2 to +6 |

For each BOM line the actual bound is bounded by the configured index bound, which is in turn bounded by the unconfigured index bound. See BOM line D1 above for a clear example of this relation. If an individual BOM line is affected by geometric or assembly overrides, the index bounds for these override data model objects must be used in the union described above.

Storage complexity: The storage required by the index, according to some disclosed embodiments, is:

$$bytes_{total} = n_{obj} \cdot bytes_{simplified}$$

where $bytes_{total}$ is the storage required; $n_{obj}$ is the number of data model objects that have (directly or indirectly) geometric bounds; and $bytes_{simplified}$ is the (average) number of bytes required to store a simplified bound.

Where the size of the simplified bound is bounded by the simplification rule, the total storage for the index is also bounded, no matter how complex the network.

Time complexity: The time complexity for updating the index on a geometric or network change is bounded by:

$$t_{update} = k_1 \cdot n_{depnodes} \cdot t_{simplification} + k_2 \cdot n_{depedges}$$

where $t_{update}$ is the time to update the index; $k_1$ is a constant; $n_{depnodes}$ is the number of network nodes that depend on the change; $t_{simplification}$ is the time to simplify the bounds; $k_2$ is a constant; $n_{depedges}$ is the number of network edges that depend on the change; and $t_{simplification}$ depends both on the choice of simplification rule, and the number of dependent edges at a given node.

For rarely-used parts and assemblies in product structures, update time is proportional to the maximum BOM tree depth. For frequently-used parts and assemblies the update time can be larger. In practice, the updated geometric bound for a node (especially when the node is several edges removed from the initial update) can be identical to the original geometric bound after simplification for the reasons discussed above. This allows update to terminate more quickly, and reduces the impact of updates to frequently-used parts and assemblies.

Configurable and/or exploded structures are used in problem domains other than the product structure. For example, manufacturing assemblies and manufacturing processes can be both versioned (then configured) and exploded. The disclosed embodiments apply to, and are suited to, these and other similar problem domains. The disclosed embodiments are not limited to geometric data. Any data that can be bounded can be indexed and searched as described herein.

For example, part/assembly mass can be bounded by a single positive number, and is contained by addition (rather than geometric union) and is conditionally selected by a maximum (rather than geometric union). If a mass index is constructed, it enables queries such as—which assemblies weigh at least 5 kg.

Some systems use a range of caches to support geometric queries. These are all based upon taking a snapshot of a BOM tree, and persisting geometric bounding boxes, or other geometric information for the BOM lines. These solutions require the (expensive) generation of BOM lines, which leads to various limitations. For example, the cache is rarely up to date, because it is expensive to maintain. The cache is only available for a few assemblies. This is both because the cache is expensive to maintain, and because the total cache size scales super-linearly compared with normal persisted data size. The cache is not available for all configuration rules. Not all configuration rules are known in advance. Some configuration rules can be parameterized with values have no cheap enumeration.

By contrast, the disclosed embodiments replace a geometric bound index on BOM lines with a geometric bound index on the underlying persisted data. This link to the persisted data overcomes the above limitations. Index updates are simple to compute, and can be maintained in real time. The index can be maintained for all assemblies. The index storage scales linearly with persisted model data. The index is independent of configuration rule.

Spatial queries on geometric data and index structures to support spatial queries on geometric data have been actively researched since the 1970s, and there is a large body of published literature known to those of skill in the art. These index structures are well-suited to configured data. There is additionally a large body of published literature known to those of skill in the art which describes the suitability of different bound models for different application domains.

Other variations and modifications are considered within the scope of disclosed embodiments. For example, the simplification step described above can be omitted, giving a set of geometric bounds for each node, and weaker space guarantees. Nodes can be omitted from the geometric dependency network (but not dependencies). The nodes in the geometric dependency network can be typed. Different geometric bounds and different simplification rules can be used for different node types. Transformation of a single geometric bound need not produce a single geometric bound. For example, a rotation of an axis-aligned bounding box can be transformed to a single axis-aligned bounding box, or to a set of axis-aligned bounding boxes. For some box shapes and transformations, the set of bounding boxes can enclose a much smaller volume.

Some embodiments can include a method for identifying a line item in a data tree, comprising forming a wavefront queue of a plurality of protolines; testing a cumulative geometric bound from each of the protoline using a spatial index; configuring an identified line item from the tested protoline that is accepted; storing a plurality of candidate line items from the configured line items; and returning a set of line items from the plurality of candidate line items that have passed a geometric test. In some embodiments, the spatial index is a geometric bound index. In some embodiments, the line item is an item in a bill of material. In some embodiments, the protoline describes a path through the data tree. In some embodiments, the testing step returns true if there exists a geometric shape within the cumulative geometric bounds. In some embodiments, the wavefront queue describes a search order boundary through the data tree. In some embodiments, the search order is depth-first.

Other embodiments include one or more computer-readable storage devices or media having computer-readable code encoded thereon which, when executed, cause a data processing system to perform a method as described herein.

Other embodiments include providing a list from a bill of material satisfying a geometric search, comprising a product structure represented by an item list; a spatial index to obtain a set of candidates from the item list; and a result set from the set of candidates that satisfies a geometric test.

Other embodiments includes a system and method for finding a bill of material (BOM) line without constructing or caching an entire bill of material (BOM) tree, comprising a computer system that is configured to form a wavefront queue of a plurality of protolines; test a cumulative geometric bound from each of the protoline using a spatial index; configure an identified line item from the tested protoline that is accepted; store a plurality of candidate line items from the configured line items; and return a set of line items from the plurality of candidate line items that have passed a geometric test.

Other embodiments include a system for data management comprising a geometric model having a plurality of geometric model objects; a list of data model objects corresponding to the geometric model to define a product structure; and a geometric search result that uses a spatial index to obtain candidates to satisfy a geometric test.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for searching a bill of materials (BOM) in a data processing system, comprising:
    retrieving BOM data in a data processing system;
    forming a wavefront queue of a plurality of proto lines corresponding to the BOM data by the data processing system;
    determining the cumulative geometric bounds of multiple ones of the plurality of proto lines;
    performing a geometric bounds test, by the data processing system, on the cumulative geometric bounds of multiple ones of the plurality of proto lines;

producing a BOM line by the data processing system corresponding to each proto line that passes the geometric bounds test; and adding the produced BOM lines to a candidate results list stored in the data processing system.

2. The method of claim 1, further comprising performing a geometric test on each BOM line in the candidate results list and storing the results in a confirmed BOM list.

3. The method of claim 1, wherein the cumulative geometric bounds of multiple ones of the plurality of proto lines are determined by retrieving the cumulative geometric bounds from a spatial index.

4. The method of claim 1, further comprising removing, from the wavefront queue, any proto line having a cumulative geometric bounds that fails the geometric bounds test.

5. The method of claim 1, further comprising removing, from a BOM tree, a subtree corresponding to the removed proto line.

6. The method of claim 1, wherein the BOM line is produced by applying a configuration rule to the corresponding proto line.

7. The method of claim 1, further comprising adding, to the wavefront queue, a set of child proto lines corresponding to any proto line having a cumulative geometric bounds that passes the geometric bounds test.

8. A data processing system comprising a processor and accessible memory, the data processing system implementing a CAD system and configured to perform the steps of:
retrieving BOM data;
forming a wavefront queue of a plurality of proto lines corresponding to the BOM data;
determining the cumulative geometric bounds of multiple ones of the plurality of proto lines;
performing a geometric bounds test on the cumulative geometric bounds of multiple ones of the plurality of proto lines;
producing a BOM line corresponding to each proto line that passes the geometric bounds test; and
adding the produced BOM lines to a stored candidate results list.

9. The data processing system of claim 8, the data processing system further configured to perform the step of performing a geometric test on each BOM line in the candidate results list and storing the results in a confirmed BOM list.

10. The data processing system of claim 8, wherein the cumulative geometric bounds of multiple ones of the plurality of proto lines are determined by retrieving the cumulative geometric bounds from a spatial index.

11. The data processing system of claim 8, the data processing system further configured to perform the step of removing, from the wavefront queue, any proto line having a cumulative geometric bounds that fails the geometric bounds test.

12. The data processing system of claim 8, the data processing system further configured to perform the step of removing, from a BOM tree, a subtree corresponding to the removed proto line.

13. The data processing system of claim 8, wherein the BOM line is produced by applying a configuration rule to the corresponding proto line.

14. The data processing system of claim 8, the data processing system further configured to perform the step of adding, to the wavefront queue, a set of child proto lines corresponding to any proto line having a cumulative geometric bounds that passes the geometric bounds test.

15. A physical computer readable medium encoded with and comprising computer-executable instructions that, when executed, cause a data processing system to perform the steps of:
retrieving BOM data in a data processing system;
forming a wavefront queue of a plurality of proto lines corresponding to the BOM data by the data processing system;
determining the cumulative geometric bounds of multiple ones of the plurality of proto lines;
performing a geometric bounds test, by the data processing system, on the cumulative geometric bounds of multiple ones of the plurality of proto lines;
producing a BOM line by the data processing system corresponding to each proto line that passes the geometric bounds test; and
adding the produced BOM lines to a candidate results list stored in the data processing system.

16. The computer readable medium of claim 15, further comprising computer-executable instructions that, when executed, cause a data processing system to perform the further step of performing a geometric test on each BOM line in the candidate results list and storing the results in a confirmed BOM list.

17. The computer readable medium of claim 15, wherein the cumulative geometric bounds of multiple ones of the plurality of proto lines are determined by retrieving the cumulative geometric bounds from a spatial index.

18. The computer readable medium of claim 15, further comprising computer-executable instructions that, when executed, cause a data processing system to perform the further step of removing, from the wavefront queue, any proto line having a cumulative geometric bounds that fails the geometric bounds test.

19. The computer readable medium of claim 15, further comprising computer-executable instructions that, when executed, cause a data processing system to perform the further step of removing, from a BOM tree, a subtree corresponding to the removed proto line.

20. The computer readable medium of claim 15, wherein the BOM line is produced by applying a configuration rule to the corresponding proto line.

21. The computer readable medium of claim 15, further comprising computer-executable instructions that, when executed, cause a data processing system to perform the further step of adding, to the wavefront queue, a set of child proto lines corresponding to any proto line having a cumulative geometric bounds that passes the geometric bounds test.

\* \* \* \* \*